(12) United States Patent
Comeau et al.

(10) Patent No.: US 12,732,149 B2
(45) Date of Patent: Sep. 8, 2026

(54) DIFFERENTIAL DIGITAL STEP ATTENUATORS WITH LEAKAGE CANCELLATION

(71) Applicant: BAE SYSTEMS Information and Electronic Systems Integration Inc., Nashua, NH (US)

(72) Inventors: Jonathan P. Comeau, Winchester, MA (US); Douglas S. Jansen, Durango, CO (US); Gary M. Madison, Waltham, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 334 days.

(21) Appl. No.: 18/354,354

(22) Filed: Jul. 18, 2023

(65) Prior Publication Data

US 2025/0030393 A1 Jan. 23, 2025

(51) Int. Cl.
*H03H 7/25* (2006.01)
*H03H 11/24* (2006.01)

(52) U.S. Cl.
CPC ............ *H03H 7/25* (2013.01); *H03H 11/245* (2013.01)

(58) Field of Classification Search
CPC ............................... H03H 7/25; H03H 11/245
USPC ........................................................ 333/81 R
See application file for complete search history.

(56) References Cited

U.S. PATENT DOCUMENTS 4,710,726 A * 12/1987 Czarnul ................... G06G 7/14 330/69
8,179,186 B2 5/2012 Flewelling et al.
8,866,531 B2 * 10/2014 Gupta ................ H03F 3/45188 327/336

* cited by examiner

*Primary Examiner* — Andrea Lindgren Baltzell
*Assistant Examiner* — Abigail Amir Yaldo
(74) *Attorney, Agent, or Firm* — Gary McFaline

(57) ABSTRACT

An attenuator circuit includes a differential input having first and second inputs, and a differential output having first and second outputs. The attenuator circuit further includes a first transistor coupled between the first input and the first output, a second transistor coupled between the second input and the second output, a third transistor coupled between the first input and the second output, and a fourth transistor coupled between the second input and the first output. During a pass-through state, the first and second transistors are enabled, and the third and fourth transistors may be disabled. During an attenuation state, the first, second, third, and fourth transistors are all disabled. An attenuator network (e.g., T or Pi network) may have its differential input terminals coupled to the first and second inputs of the differential input, and its differential output terminals coupled to the first and second outputs of the differential output.

13 Claims, 9 Drawing Sheets

704

Cause to enable, during a pass-through mode of operation, (i) a first transistor 110 coupled between a first input 127a and a first output 128a, and (ii) a second transistor 111 coupled between a second input 127b and a second output 128b; and
cause to disable, during the pass-through mode, (i) a third transistor 144 coupled between the first input 127a and the second output 128b, and (ii) a fourth transistor 148 coupled between the second input 127b and the first output 128a

708

Cause to disable, during an attenuation mode of operation, the first transistor 110 and the second transistor 111; and
cause to disable, during the attenuation mode, (i) the third transistor 144, and (ii) the fourth transistor 148

FIG. 7

DIFFERENTIAL DIGITAL STEP ATTENUATORS WITH LEAKAGE CANCELLATION

STATEMENT OF GOVERNMENT INTEREST

This invention was made with government support under prime contract number 14 D 0423/19 F 0017 awarded by the United States government. The government has certain rights in the invention.

FIELD OF DISCLOSURE

The present disclosure relates to attenuators, and more particularly, to differential digital step attenuators.

BACKGROUND

An attenuator reduces an amplitude of a signal passing through the attenuator, without significantly distorting a waveform of the signal. A digital step attenuator is a type of attenuator that has two distinct states, such as (i) a pass-through or bypass state in which the signal passes through or otherwise bypasses the attenuator without significant attenuation, and (ii) an attenuation state in which the signal is attenuated with a pre-configured attenuation factor. In an example, multiple such attenuators can be arranged in series, to achieve an N-state attenuator having N number of pre-configured attenuation factors, where N is a positive integer greater than one. The state of operation of a digital step attenuator is selectable. A differential digital step attenuator receives differential signals, and outputs differential signals. There remain a number of non-trivial challenges with respect to differential digital step attenuators.

BRIEF DESCRIPTION OF THE DRAWINGS

FIG. 7 illustrates a flowchart depicting a method of reducing the effect of leakage current in an attenuator circuit, in accordance with an embodiment of the present disclosure.

Figure 1A:
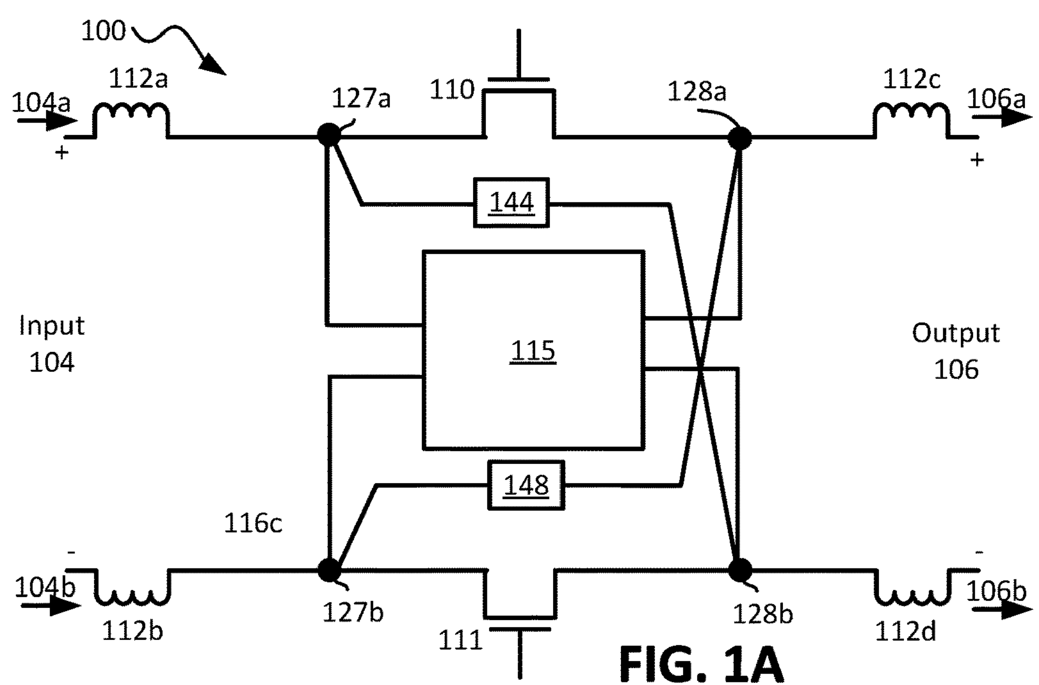
FIG. 1A illustrates a block diagram of an attenuator circuit configured to reduce the effect of leakage current, in accordance with an embodiment of the present disclosure.

Although the following detailed description will proceed with reference being made to illustrative examples, many alternatives, modifications, and variations thereof will be apparent in light of this disclosure.

DETAILED DESCRIPTION

Techniques are described herein for reducing the effect of leakage current in attenuators. In accordance with an example, the techniques can be used to form a differential digital step attenuator in which a gain of the attenuator is substantially constant or otherwise within a desired range, over a frequency range of operation. A differential digital step attenuator circuit according to one example comprises: a first pass-through switch, such as a first pass-through transistor, coupled between a first input and a first output; and a second pass-through switch, such as a second pass-through transistor, coupled between a second input and a second output. A first dummy switch, such as a transistor that matches the second pass-through transistor, is coupled between the first input and the second output, and a second dummy switch, such as a transistor that matches the first pass-through transistor, is coupled between the second input and the first output. As described below, the dummy switches facilitate cancellation of leakage current through the first and second pass-through switches. Note that the leakage current is not prevented, and that perfect cancellation of leakage current is not required (nor is perfect transistor matching). Rather, through the cancellation process, the effect of leakage current is at least beneficially reduced. A further benefit may include constant or near constant gain over the frequency range of operation of the attenuator.

General Overview

As mentioned herein above, there remain a number of non-trivial challenges with respect to differential digital step attenuators. For example, in a differential digital step attenuator, a first pass-through transistor is coupled between a first input and a first output, and a second pass-through transistor is coupled between a second input and a second output, where the first and second inputs form a differential input, and the first and second outputs form a differential output. As described above, a digital step attenuator has two distinct states, including a pass-through state and an attenuation state. The first and second pass-through transistors are switched on during the pass-through state, such that differential input signals are passed through the pass-through transistors without substantial attenuation. During the attenuation state, the first and second pass-through transistors are switched off, and differential input signals are effectively diverted or otherwise pass through an attenuator network (such as a "T" network circuit, or a "pi" network circuit, or another appropriate type of attenuator network), to achieve a desired attenuation. However, when the first and second pass-through transistors are switched off during the attenuation state, the first and second pass-through transistors may experience leakage currents due to off-state parasitic capacitance. Furthermore, the off-state parasitic capacitance is based on an operating frequency of the differential input signals. As a result, the leakage currents through the first and second pass-through transistors are frequency dependent, resulting in the attenuation factor also being frequency dependent. Accordingly, it may be difficult to maintain a sufficiently flat gain performance over a wide range of frequency. For example, high attenuation values tend to suffer poor gain flatness at high frequencies, as the pass-through leakage current increases at higher frequencies. Thus, while a desired attenuation ratio may be achieved at low frequencies, that ratio may change in a non-trivial fashion at high frequencies. Such frequency-dependent gain variance may be unacceptable for certain application such as, for example, wide band and/or ultra-wide band attenuators.

Accordingly, techniques are described herein to form a differential digital step attenuator in which a relatively flat range of gain may be maintained over the frequency range of operation. For example, a differential digital step attenuator circuit comprises: a first pass-through switch, such as a first pass-through transistor, coupled between a first input and a first output; and a second pass-through switch, such as a second pass-through transistor, coupled between a second input and a second output. Furthermore, a first dummy switch, such as a first dummy transistor that is well-matched to the second pass-through transistor, is coupled between the first input and the second output; and a second dummy switch, such as a second dummy transistor that is well-matched to the first pass-through transistor, is coupled between the second input and the first output. Such a cross-coupling of the dummy switches facilitates cancellation of leakage current through the first and second pass-through switches, by effectively creating first and second current summing nodes at the differential output of the attenuator, where leakage currents of similar magnitudes but opposite polarities are summed together and thereby diminish one another to eliminate or otherwise reduce the impact of leakage current passing through the first and second pass-through switches (when those switches are in their respective off-states). A further benefit may include constant or near constant gain over the frequency range of operation of the attenuator.

In an example, a first pass-through transistor, a second pass-through transistor, a first dummy transistor, and a second dummy transistor are substantially matched. For example, the transistors may have substantially the same size, and be formed using the same processes, such as transistors from the same wafer, or transistor formed using an otherwise well-controlled and consistent fabrication process. Alternatively, the transistors may be matched via an empirical testing process that biases a given transistor and measures transistor performance (e.g., transistor leakage during off-state), so transistors having sufficiently similar performance in response to a common stimulus can be matched or otherwise paired. Alternatively, the transistors may be matched via a theoretical process that presumes certain knowledge of the transistors based on their forming processes. More generally, any suitable matching process can be used. Accordingly, in an example, for any given frequency of operation, the off-state parasitic capacitances of the first and second pass-through transistors and the first and second dummy transistors substantially match (e.g., size and/or performance criteria are within 1% or 2% of each other, or some other matching metric suitable for a given application). Hence, for a given frequency of operation and because amplitude of input signals to these transistors are substantially the same due to differential signaling, amplitude of the leakage currents through the first and second pass-through transistors and the first and second dummy transistors substantially match (e.g., are within 1% to 2% of each other, or some other matching metric suitable for a given application). The cross-coupling of the dummy transistors creates summing junctions, where currents having well-matched amplitudes, but opposite polarity combine, so as to cancel at least some of the leakage current at the differential output.

As described above, the digital step attenuator has two distinct states, such as the pass-through state, and the attenuation state. The first and second pass-through transistors are switched on during the pass-through state, such that the input differential signals are output through the pass-through transistors without substantial attenuation. The first and second dummy transistors are switched off during the pass-through state.

Figure 5:
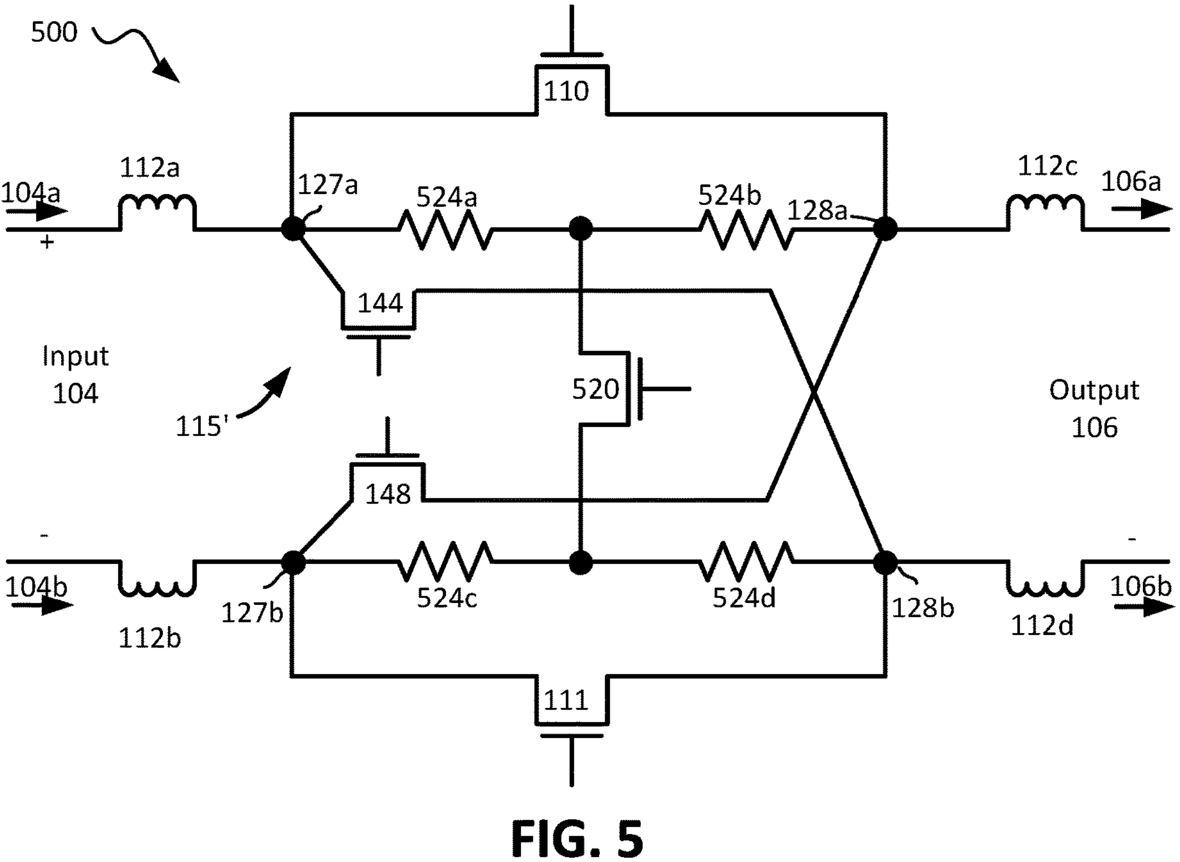
FIG. 5 illustrates an attenuator circuit configured to reduce the effect of leakage current, in accordance with another embodiment of the present disclosure.

During the attenuation state, the first and second pass-through transistors are switched off, and the input differential signals pass through an attenuator network (such as a "T" network circuit, or a "pi" network circuit, or another appropriate type of attenuator network), to achieve a desired attenuation. Some examples of such an attenuator network are illustrated in FIGS. 1B and 5 described below, but any differential attenuator network can be used.

In some such examples, during the attenuation state, when the first and second pass-through transistors are switched off, these pass-through transistors experience leakage currents that are frequency dependent. Also, during the attenuation state, the dummy transistors are also switched off, and the dummy transistors also experience leakage currents that are frequency dependent.

Figure 2A:
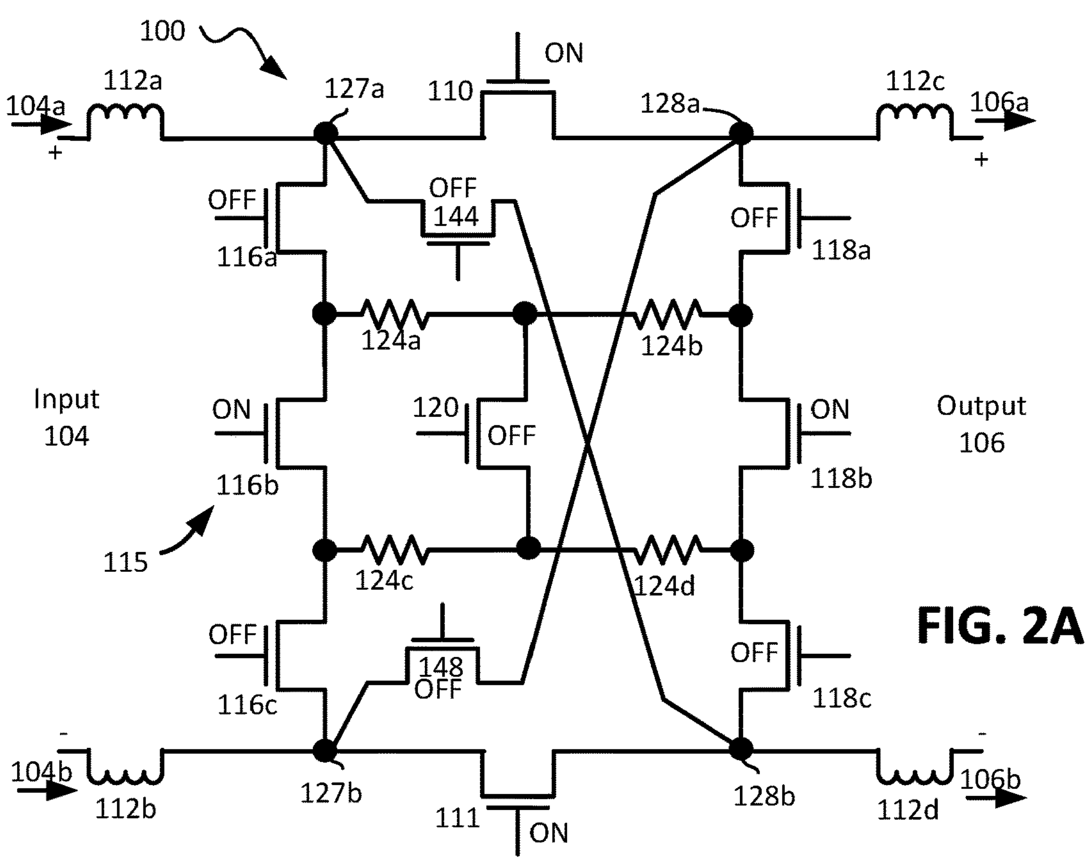
FIGS. 2A and 2B respectively illustrate the pass-through state of operation of the attenuator circuit of FIGS. 1A and 1B, and the attenuation state of operation of the attenuator circuit of FIGS. 1A and 1B, in accordance with an embodiment of the present disclosure.
Figure 2B:
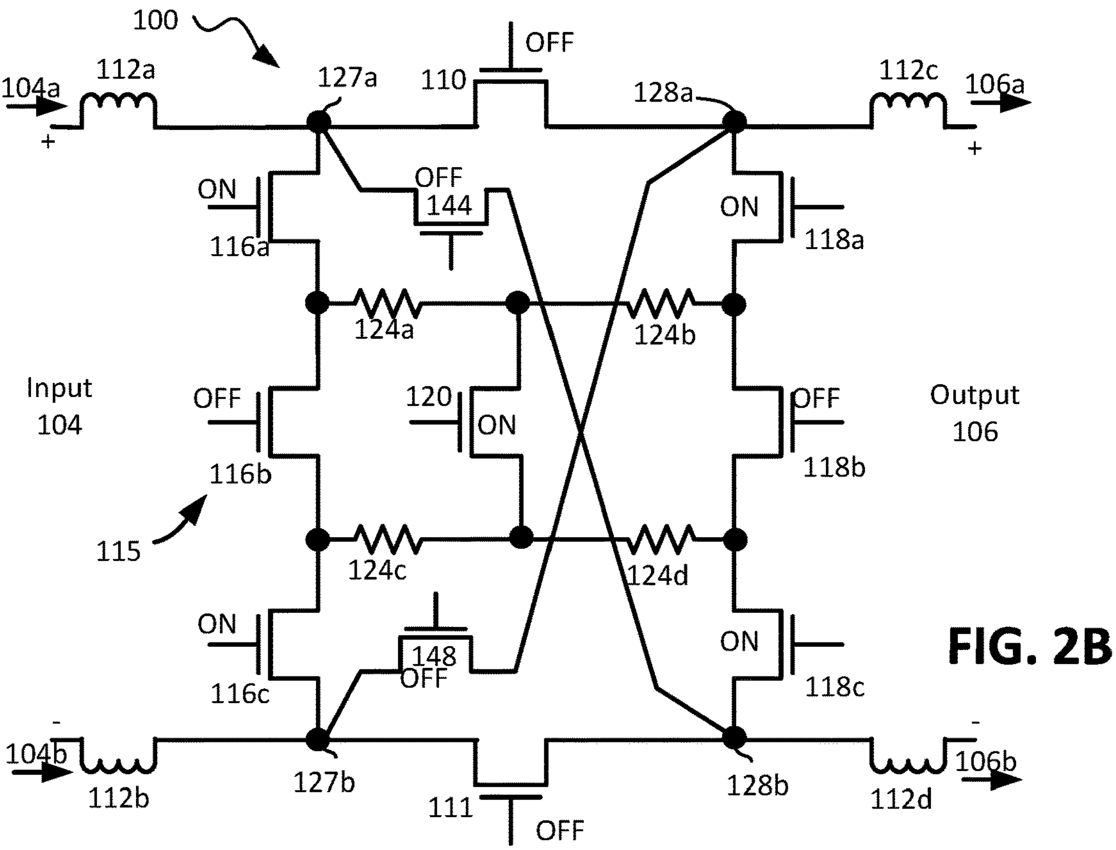
Figure 2C:
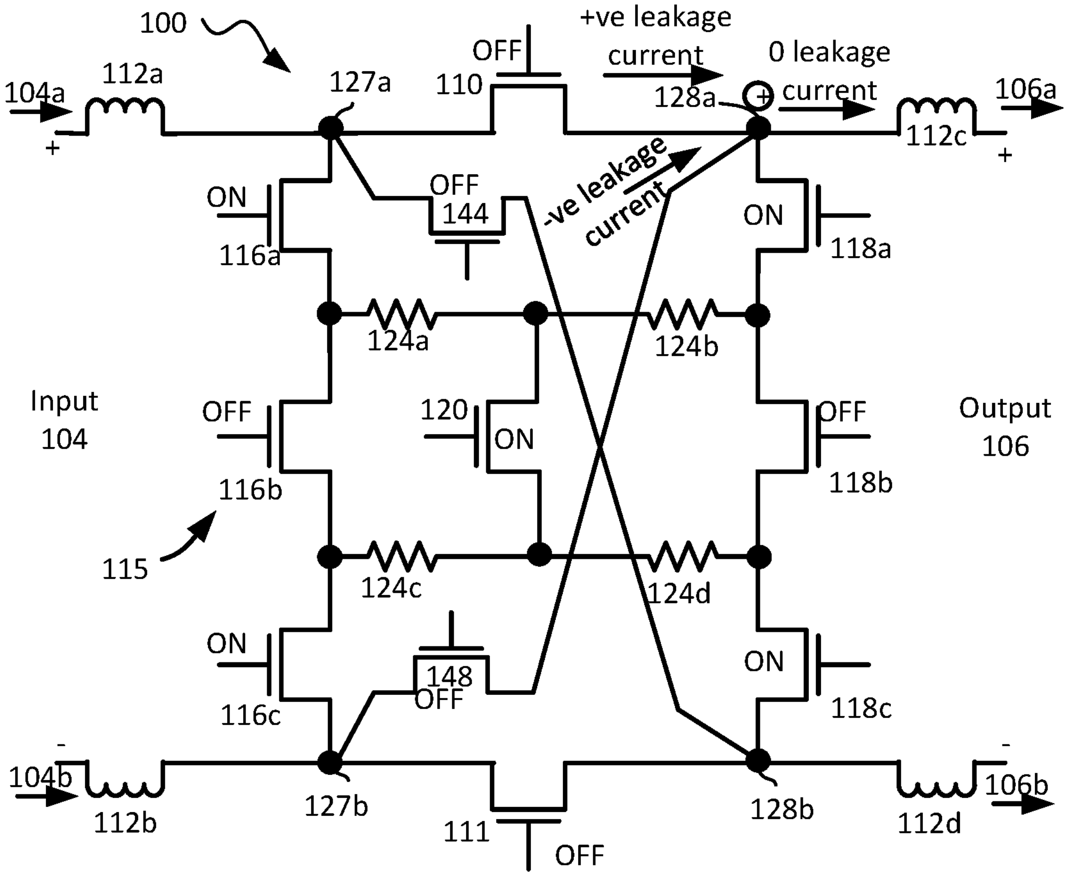
FIG. 2C illustrates cancellation of leakage currents in the circuit of FIGS. 1A-2B during the attenuation state of operation of the attenuator circuit, in accordance with an embodiment of the present disclosure.

Thus, for any given frequency within the frequency range of operation, leakage currents through the first and second pass-through transistors and the first and second dummy transistors substantially match (e.g., have same substantially amplitude), as described above. Furthermore, a first input signal and a second input signal received at the first and second inputs are differential signals. Thus, in differential signaling, the two input signals are complementary signals. For example, the first and second input signals are substantially equal in magnitude, but of opposite polarity. Accordingly, because of the same leakage current profiles of the first pass-through transistor and the second dummy transistor over the frequency range of operation, the leakage current through the first pass-through transistor and the leakage current through the second dummy transistor may be substantially equal in magnitude, but of opposing polarity, for any given frequency within the frequency range of operation. Accordingly, as illustrated in FIG. 2C, a positive (+ve) leakage current through the first pass-through transistor and a negative (−ve) leakage current through the second dummy transistor (or a negative leakage current through the first pass-through transistor and a positive leakage current through the second dummy transistor) sum with one another to cancel at least some of the leakage current passing through the first and pass-through transistor, thus reducing the overall leakage at the first output, such that a first output signal at the first output doesn't have any substantial contribution from the leakage current of the first pass-through transistor.

Similarly, the leakage current through the second pass-through transistor and the leakage current through the first dummy transistor sum with one another to cancel at least some of the leakage current passing through the second pass-through transistor, thus reducing the overall leakage at the second output, such that the second output signal at the second output doesn't have any substantial contribution from the leakage current of the second pass-through transistor.

Accordingly, as the leakage currents through the first and second pass-through transistors are diminished to the point where they have a negligible effect on the first and second output signals, the attenuation and the gain of the attenuator circuit are not adversely affected by the frequency dependency of the off-state capacitances of the first and second pass-through transistors. Hence, such a differential attenuator configuration can be used to help eliminate or at least reduce frequency dependency of the attenuation or gain of the attenuator circuit, and the gain of the attenuator circuit may now be substantially constant (or at least less varying) over a frequency range of operation of the attenuator circuit. Thus, addition of the dummy transistors improves gain versus frequency performance of the attenuator circuit (e.g., relatively uniform attenuation ratio over frequency), without affecting the performance of the attenuator circuit during the pass-through state of the attenuator circuit. Furthermore, a relatively high attenuation factor can be achieved, e.g., at relatively high frequencies, due to cancellation of the leakage currents.

As described above, during the attenuation state, the input differential signals pass through a circuit, such as a "T" network circuit, or a "pi" network circuit, or another appropriate type of circuit, to achieve a desired attenuation. In the example of FIG. 1B, this circuit includes first, second, and third transistors in series between the first and second inputs, and fourth, fifth, and sixth transistors in series between the first and second outputs. There are also multiple resistors and a shunt transistor within this circuit, as described herein below in further detail.

Figure 3:
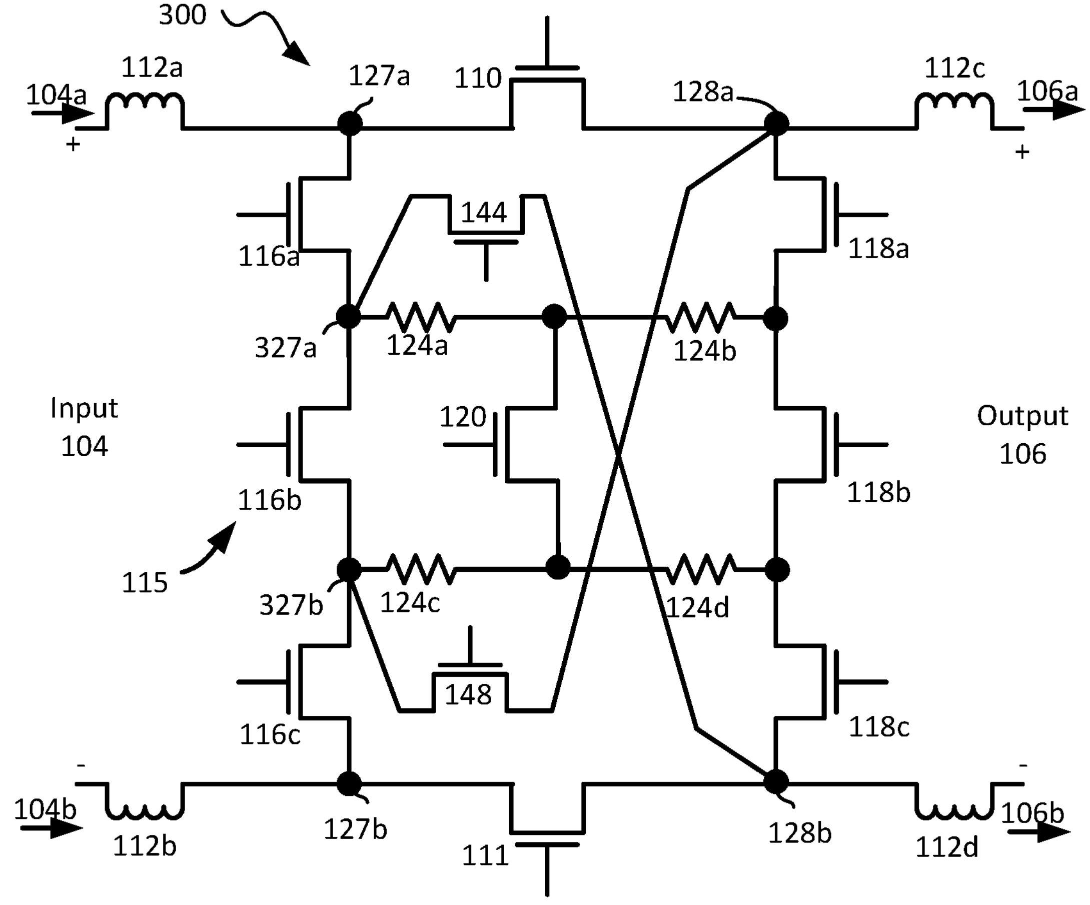
FIG. 3 illustrates an attenuator circuit configured to reduce the effect of leakage current, in accordance with another embodiment of the present disclosure.
Figure 4:
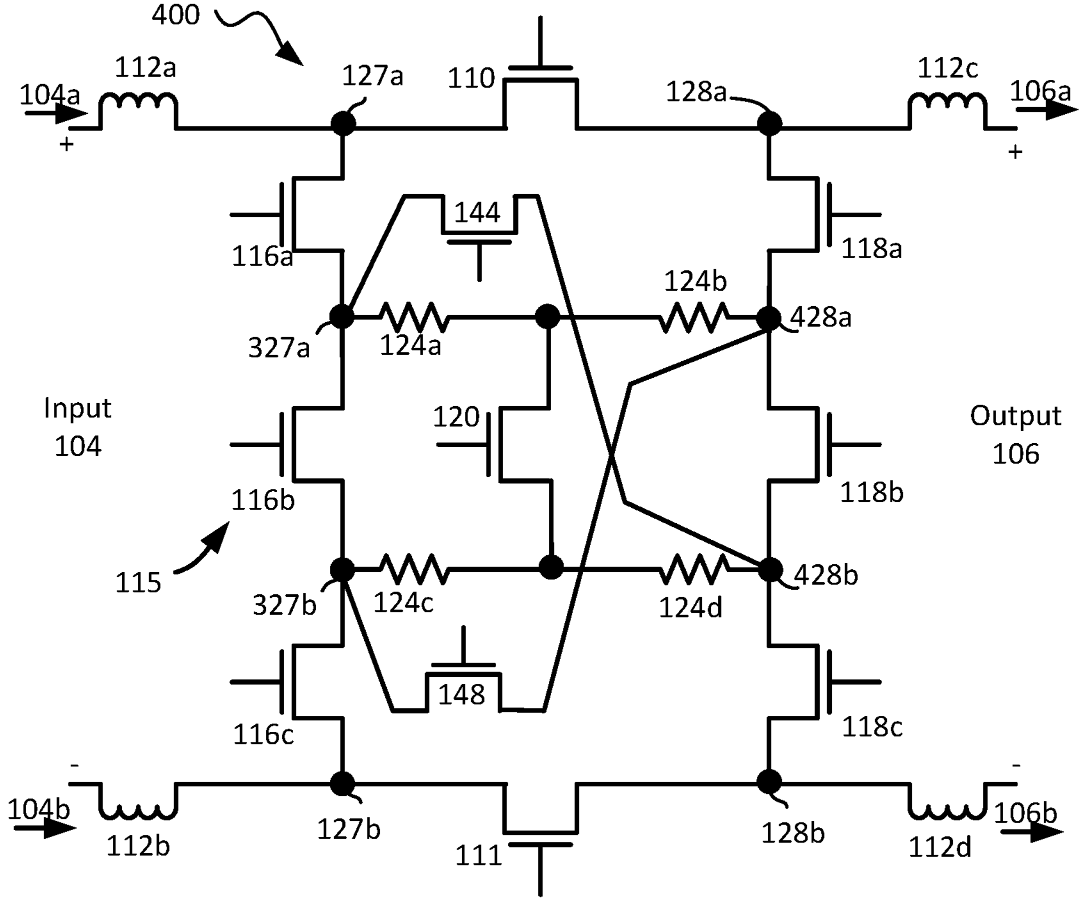
FIG. 4 illustrates an attenuator circuit configured to reduce the effect of leakage current, in accordance with another embodiment of the present disclosure.

In one embodiment and as illustrated in FIG. 3, instead of coupling an end of the first dummy transistor to the first input, the end of the first dummy transistor may be coupled between the first and second transistors. Similarly, instead of coupling an end of the second dummy transistor to the second input, the end of the second dummy transistor may be coupled between the second and third transistors. In another embodiment and as illustrated in FIG. 4, instead of coupling another end of the first dummy transistor to the second output, the other end of the first dummy transistor may be coupled between the fifth and sixth transistors. Similarly, instead of coupling another end of the second dummy transistor to the first output, the other end of the second dummy transistor may be coupled between the fourth and fifth transistors. Such variations in the coupling of the dummy transistors may reduce losses through the dummy transistors during the pass-through state of the attenuator circuit, without affecting the advantages of leakage current matching provided by the dummy transistors during the attenuation state of the attenuator circuit, as described in further detail below. Numerous configurations and variations will be apparent in light of this disclosure.

It should be readily understood that the meaning of "above" and "over" in the present disclosure should be interpreted in the broadest manner such that "above" and "over" not only mean "directly on" something but also include the meaning of over something with an intermediate feature or a layer therebetween. As will be appreciated, the use of terms like "above" "below" "beneath" "upper" "lower" "top" and "bottom" are used to facilitate discussion and are not intended to implicate a rigid structure or fixed orientation; rather such terms merely indicate spatial relationships when the structure is in a given orientation.

Architecture

Figure 1B:
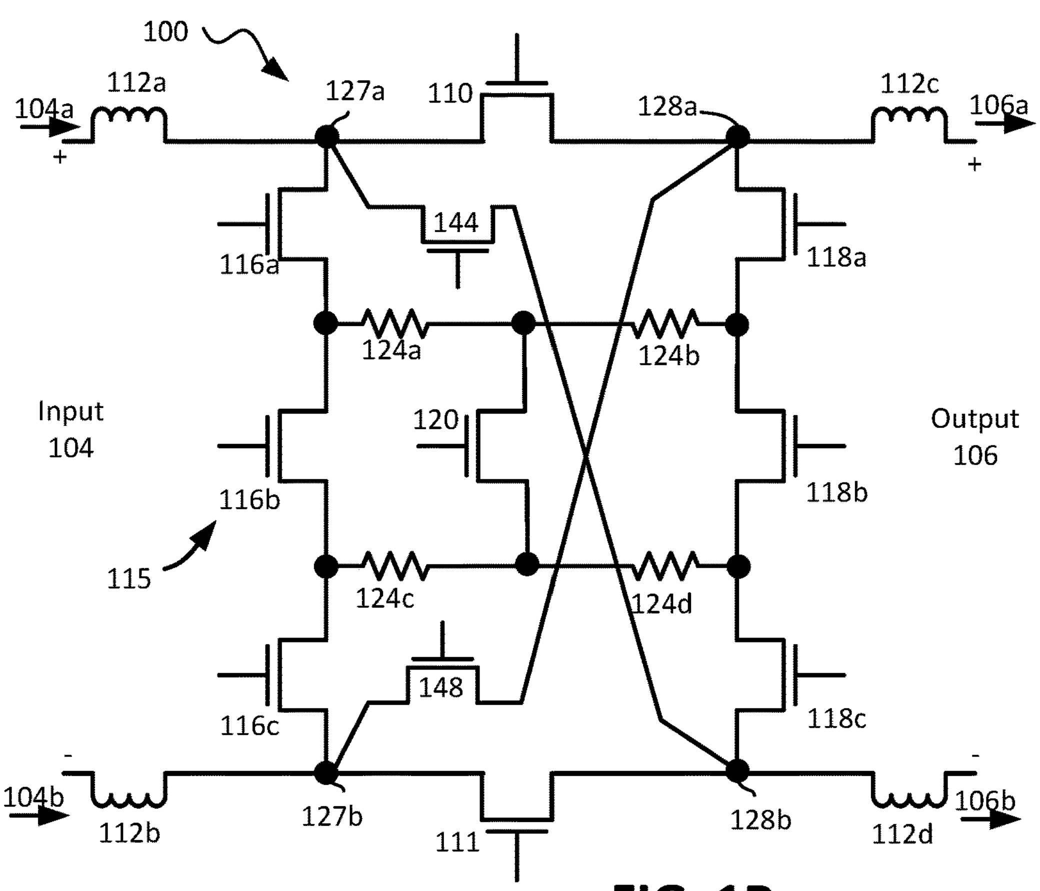
FIG. 1B illustrates an example implementation of the attenuator circuit of FIG. 1A, in accordance with an embodiment of the present disclosure.

FIG. 1A illustrates an attenuator circuit 100 in which a pair of cross-coupled components 144, 148 allow leakage currents in the attenuator circuit 100 to be at least partially cancelled, in accordance with an embodiment of the present disclosure. FIG. 1B illustrates an example implementation of the attenuator circuit 100 of FIG. 1A, in accordance with an embodiment of the present disclosure.

Referring to FIG. 1A, the attenuator circuit 100 comprises input nodes 127*a* and 127*b* that receive a pair of signals 104*a*, 104*b*, respectively. Thus, an input signal 104 of the circuit 100 comprise a pair of input signals 104*a*. 104*b* received at the input nodes 127*a* and 127*b*, respectively. Such a pair of input signals may be referred to as a differential input signal. As illustrated, the signal 104*a* is received at the input node 127*a* through an inductor 112*a*, and the signal 104*b* is received at the input node 127*b* through an inductor 112*b*.

Similarly, the attenuator circuit 100 comprises output nodes 128*a* and 128*b* that provide a pair of output signals 106*a*, 106*b*, respectively. Thus, the output signal 106 of the circuit 100 comprises a pair of output signals 106*a*, 106*b* output at the output nodes 128*a* and 128*b*, respectively. Such a pair of output signals may be referred to as a differential output signal. As illustrated, an inductor 112*c* is between the output node 128*a* and an output of the circuit 100, and an inductor 112*d* is between the output node 128*b* and another output of the circuit 100.

In one embodiment, the circuit 100 is a digital step attenuator circuit. For example, the circuit 100 has a pass-through state of operation, and an attenuation state of operation. During the pass-through state of operation, the input signal 104 is transmitted as the output signal 106 with substantially zero, or relatively less, attenuation. Thus, there an attenuation of 0 dB, or an attenuation of less than 0.1 dB, or less than 0.5 dB, or less than 1 dB, or less than 2 dB, or less than 5 dB, for example, during the pass-through state of operation of the attenuator circuit 100.

The circuit 100 also has the attenuation state of operation, during which the input signal 104 is transmitted as the output signal 106 with a fixed or specific level of attenuation. For example, in the attenuation state of operation, the circuit 100 may have an attenuation of 10 dB, or 15 dB, or 20 dB, or another pre-configured level of attenuation.

The circuit 100 comprises a transistor 110 coupled between the nodes 127*a* and 128*a*. For example, the transistor 110 is coupled between the inductors 112*a* and 112*c*. A first current terminal of the transistor 110 is coupled to the node 127*a* and the inductor 112*a*, and a second current terminal of the transistor 110 is coupled to the node 128*a* and the inductor 112*c*, as illustrated in FIG. 1A.

Similarly, the circuit 100 comprises a transistor 111 coupled between the nodes 127*b* and 128*b* (e.g., the transistor 111 is coupled between the inductors 112*b* and 112*d*). For example, a first current terminal of the transistor 111 is coupled to the node 127*b* and the inductor 112*b*, and a second current terminal of the transistor 111 is coupled to the node 128*b* and the inductor 112*d*, as illustrated in FIG. 1A.

In an example, the circuit 100 also comprises a component 144 coupled between the input node 127*a* and the output node 128*b*, and a component 148 coupled between the input node 127*a* and the output node 128*b*. As described below, the components 144, 148 facilitate to eliminate, or at least reduce, effects of leakage current in the circuit 100, and thereby facilitate to maintain substantially fixed gain or attenuation factor of the circuit 100 over a wide range of operating frequencies of the circuit 100. In the example implementation of FIG. 1B, the components 144 and 148 are implemented using respective transistors, as described in further detail below.

In one embodiment, the circuit 100 further comprises an attenuator network 115 coupled between the nodes 127*a*, 127*b*, 128*a*, 128*b*. FIG. 1B illustrates an example of the attenuator network 115. For example, in FIG. 1B, the circuit is implemented as a "T" network. In another example, the attenuator network 115 may be implemented differently, such as a "pi" network (e.g., see FIG. 6). Other examples may be implemented with any attenuator network suitable for a given application.

In one embodiment, during the attenuation state, the attenuator network 115 is used to attenuate the input signal 104 with a fixed or specific attenuation level. For example, a substantially fixed attenuation may be achieved by the attenuator network 115.

Referring to the example attenuator network 115 of FIG. 1B, transistors 116*a*, 116*b*, 116*c* are coupled in series between input nodes 127*a* and 127*b*. Similarly, transistors 118*a*, 118*b*, 118*c* are coupled in series between input nodes 128*a* and 128*b*.

In one embodiment, the attenuator network 115 also comprises a resistor 124*a* having a first end coupled between the transistors 116*a* and 116*b*. For example, the first end of the resistor 124*a* is coupled to a current terminal of the transistor 116*a* and also to a current terminal of the transistor 116*b*. A second end of the resistor 124*a* is coupled to a first end of another resistor 124*b*. A second end of the resistor 124*b* is coupled between the transistors 118*a* and 118*b*. For example, the second end of the resistor 124*b* is coupled to a current terminal of the transistor 118*a* and also to a current terminal of the transistor 118*b*.

Similarly, in one embodiment, the attenuator network 115 also comprises a resistor 124*c* having a first end coupled between the transistors 116*b* and 116*c*. For example, the first end of the resistor 124*c* is coupled to a current terminal of the transistor 116*b* and also to a current terminal of the transistor 116*c*. A second end of the resistor 124*c* is coupled to a first end of another resistor 124*d*. A second end of the resistor 124*d* is coupled between the transistors 118*b* and 118*c*. For example, the second end of the resistor 124*d* is coupled to a current terminal of the transistor 118*b* and also to a current terminal of the transistor 118*c*. A transistor 120 has a first current terminal coupled between the resistors 124*a* and 124*b*, and a second current terminal coupled between the resistors 124*c* and 124*d*.

Figure 1C:
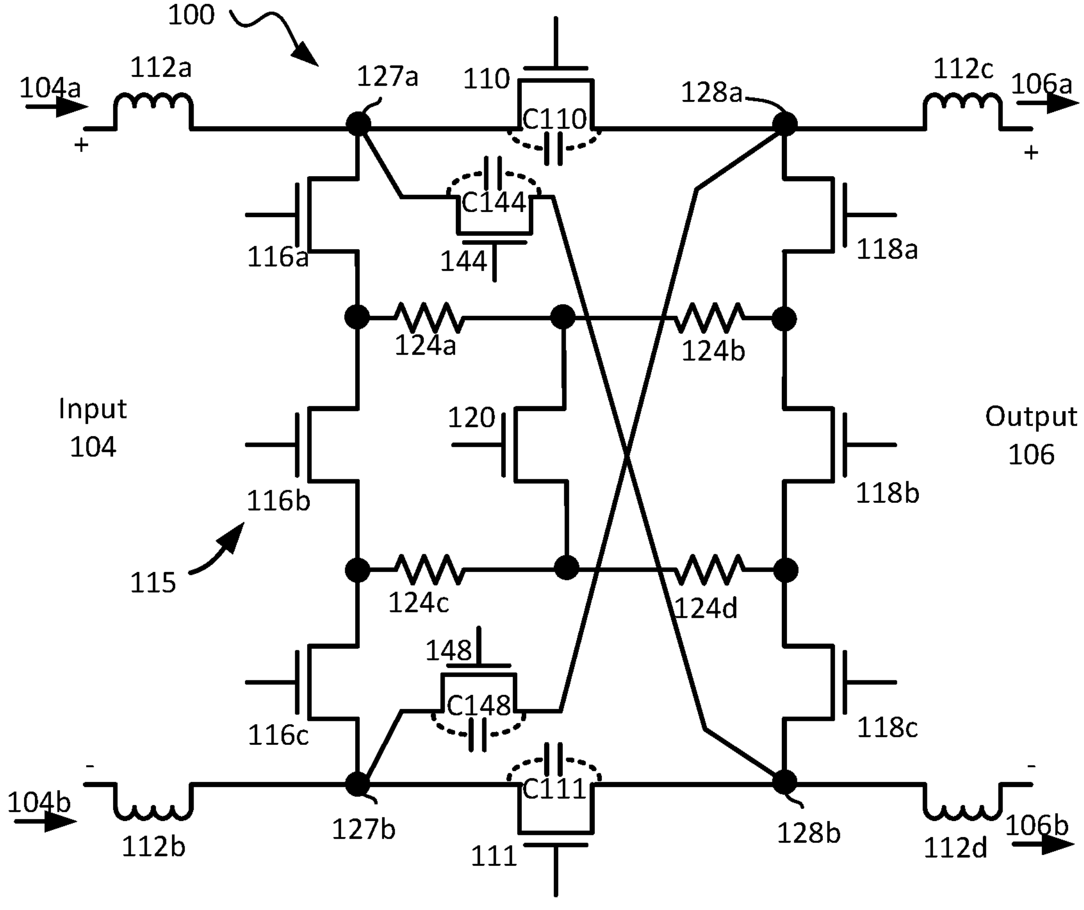
FIG. 1C illustrates off-state parasitic capacitance of various transistors of the attenuator circuit of FIGS. 1A and 1B, in accordance with an embodiment of the present disclosure.

FIG. 1C illustrates off-state parasitic capacitance of various transistors of the attenuator circuit 100 of FIGS. 1A and 1B, in accordance with an embodiment of the present disclosure. For example, the transistor 110 has an off-state parasitic capacitance C110, the transistor 111 has an off-state parasitic capacitance C111, the transistor 144 has an off-state parasitic capacitance C114, and the transistor 148 has an off-state parasitic capacitance C148, and so on. These capacitances are further described below.

Note that although the other transistors (such as 116*a*, . . . , 116*c*, 118*a*, . . . , 118*c*, 120) also may have such off-state parasitic capacitances, such off-state parasitic capacitances of these transistors are not specifically labelled in FIG. 1C for purposes of illustrative clarity. In an example, the inductors 112*a*, . . . , 112*d* are tuned with respect to the off-state parasitic capacitances of various transistor of the circuit 100. Thus, the inductors 112*a*, . . . , 112*d* are used for impedance matching, in an example. In an example, in addition to, or instead of, the inductors 112*a*, . . . , 112*d*, a different matching network (such as a relatively complex differential matching network) may be used for impedance matching. In an example, the inductors 112*a*, . . . , 112*d* may be tuned to one or more transmission line segments. In yet another example, the inductors 112*a*, . . . , 112*d* or a matching network may be absent from the circuit 100. Thus, a presence and/or a configuration of an impedance matching network, including the inductors 112*a*, . . . , 112*d*, are implementation specific, and may vary from one implementation to another.

As described above, the circuit 100 has a pass-through state of operation, and an attenuation state of operation. FIG. 2A illustrates the pass-through state of operation of the attenuator circuit 100 of FIGS. 1A and 1B, and FIG. 2B illustrates the attenuation state of operation of the attenuator circuit 100 of FIGS. 1A and 1B, in accordance with an embodiment of the present disclosure.

Referring to FIG. 2A, illustrated are operational states of the various transistors of the circuit 100, e.g., during the pass-through state of operation of the circuit 100. For example, during the pass-through state of operation of the circuit 100, the transistors 110 and 111 are enabled or turned on. Also, transistors 116*a*, 116*c*, 118*a*, 118*c*, and 120 are disabled or turned off, and transistors 116*b* and 118*b* are enabled or turned on. For example, a controller (not illustrated in FIGS. 1A-2A) causes the various transistors to be turned on or off during the pass-through state of operation of the circuit 100, e.g., in accordance with the above description of FIG. 2A.

Because the transistor 110 is turned on, the signal 104*a* from the input node 104*a* is transmitted through the turned-on transistor 110 to the output node 128*a*, and the circuit 100 outputs the signal 104*a* as signal 106*a*. e.g., without substantial attenuation (e.g., with attenuation of 0 dB, or at most 0.1 dB, or 0.5 dB, or 1 dB, or 2 dB, or 5 dB, for example). Similarly, the signal 104*b* from the input node 104*b* is transmitted through the turned-on transistor 111 to the output node 128*b*, and the circuit 100 outputs the signal 104*b* as signal 106*b*, e.g., without substantial attenuation (e.g., with attenuation of 0 dB, or at most 0.1 dB, or 0.5 dB, or 1 dB, or 2 dB, or 5 dB, for example).

Because the transistors 116*a*, 116*c*, 118*a*, 118*b* are off, there is substantially no current flow (e.g., other than minor leakage current, described below) through the attenuator network 115 comprising the transistors 116*a*, 116*b*, 116*c*, 118*a*, 118*b*, 118*c*, 120 and the resistors 124*a*, . . . , 124*d*. Some leakage currents may flow through the transistors 116*a* and 116*c*, e.g., due to parasitic or off-state capacitance of the transistors 116*a* and 116*c*. Such current may be based on a frequency of the input and output signals 104, 106, and may be higher for higher frequency signals (such as RF signals or microwave signals). However, as the transistor 116*b* is turned on, leakage current from the signal 104*a* through the transistor 116*a* and leakage current from the signal 104*b* through the transistor 116*c* may cancel out, e.g., due to the differential nature of the input signals 104*a* and 104*b*. Accordingly, such leakage current through the transistors 116*a* and/or 116*c* may not propagate through the attenuator network 115 and may not reflect in the output signals 106*a* and/or 106*b*. Hence, such leakage current through the transistors 116*a* and/or 116*c* may not affect an attenuation factor or gain of the attenuator circuit 100 during the pass-through state of the circuit 100. Similarly, any leakage currents through the transistors 118*a* and/or 118*c* may not affect an attenuation or gain of the attenuator circuit 100 during the pass-through state of the circuit 100.

Note that the transistors 144 and 148 are off during the pass-through state of operation of the circuit 100. There may be some leakage current through the transistors 144 and 148. However, because the transistors 110 and 111 are on or enabled, leakage current through the transistors 144 and 148 are not significant. As described below, such leakage current through the transistors 144 and 148 may be made even smaller in the circuits 300 and 400 of FIGS. 3 and 4, respectively.

Referring now to FIG. 2B, illustrated are operational states of the various transistors of the circuit 100, during the attenuation state of operation of the circuit 100. For example, during the attenuation state of operation of the circuit 100, the transistors 110 and 111 are disabled or turned off. Also, transistors 116*a*, 116*c*, 118*a*, 118*c*, and 120 are enabled or turned on, and transistors 116*b* and 118*b* are disabled or turned off. For example, a controller (not illustrated in FIGS. 1A-2B) causes the various transistors to be turned on or off during the attenuation state of operation of the circuit 100, e.g., in accordance with the above description of FIG. 2B.

Because the transistors 110 and 111 are turned off during the attenuation state, signals 104*a* and 104*b* may not pass through the transistors 110 and 111, respectively. The signals 104*a* and 104*b* are attenuated by the attenuator network 115 comprising the transistors 116*a*, 116*b*, 116*c*, 118*a*, 118*b*, 118*c*, 120 and the resistors 124*a*, . . . , 124*d*, with a preconfigured attenuation factor. The transistor 120 acts as a shunt between the paths of the differential signals 104*a* and 104*b* through the attenuator network 115. In an example, the transistor 120 may have a relatively high on-resistance (e.g., higher than the on-resistance of the transistors 116*a*, 116*c*, 118*a*, 118*c*), to effectively act as a shunt device. The on-resistance of the transistor 120, and the resistance values of the resistors 124*a*, . . . , 124*d* may be tuned, to configure the attenuation factor of the circuit 100 during the attenuation state of operation of the circuit 100. In another example, the transistor 120 may have a relatively low on-resistance (e.g., lower than or comparable with the on-resistance of the transistors 116*a*, 116*c*, 118*a*, 118*c*), and the circuit 100 may include a resistor (not illustrated in FIGS. 1B-2B) in series with the transistor 120, such that the combination of the transistor 120 and the series resistor has a relatively high on resistance (e.g., instead of the transistor 120 having the high on-resistance).

Also, as illustrated in FIGS. 2A and 2B, the transistors 144 and 148 are off. Thus, the transistors 144 and 148 are off during both the pass-through state and the attenuation state of the circuit 100.

Referring again to FIG. 2B, during the attenuation state of the circuit 100, the transistors 110 and 111 are off. However, due to off-state capacitances C110 and C111 (see FIG. 1C), there may be leakage currents flowing through the through the transistors 110 and 111. The leakage currents through the transistors 110 and 111 may affect the attenuation factor or the level of attenuation and gain during the attenuation state of the circuit 100, and consequently the attenuation ratio of the circuit 100. A desired attenuation ratio may be achieved by taking into account the leakage currents through the transistors 110, 111, and accordingly tuning the attenuator network 115 comprising the transistors 116*a*, 116*b*, 116*c*, 118*a*, 118*b*, 118*c*, 120 and the resistors 124*a*, . . . , 124*d*.

However, the leakage current flowing through the transistors 110 and 111 are frequency dependent. For example, for relatively high frequency signals, such as RF signals or microwave signals, the leakage current flowing through the through the transistors 110 and 111 changes with frequency. Also, in an example, the input signals 104*a*, 104*b* may be RF signals. Accordingly, if the transistors 144, 148 are absent in the circuit 100, the attenuation ratio of the circuit 100 may be relatively more dependent on a frequency of the input signals 104*a*, 104*b*.

Merely as an example, in absence of the transistors 144, 148 within the circuit 100, the attenuation ratio of the circuit 100 at frequency 20 GHz may be different from the attenuation ratio of the circuit 100 at frequency 50 GHZ, e.g., due to a different amount of leakage currents (such as relatively higher leakage currents) flowing through the transistors 110 and 111 at 50 GHz than at 20 GHz. Because of the relatively higher leakage currents flowing through the transistors 110 and 111 at 50 GHz than at 20 GHZ, an attenuation achieved at 20 GHz may be more that an attenuation achieved at 50 GHZ, in an example. Thus, if the transistors 144, 148 are absent from the circuit 100, a gain of the circuit 100 may be dependent on a frequency of operation.

For example, if the transistors 144, 148 are absent from the circuit 100, as frequency range and instantaneous bandwidths of RF systems increase, the above described leakage current through the transistors 110 and 111 may not allow to maintain a flat performance of the circuit 100, as the gain may vary with frequency of operation. Such phenomena may adversely affect ultra-wide band attenuation systems, as the gain of such a system may become non-constant over frequency.

However, as described below, the components 144, 148 (which may be corresponding transistors in the example of FIGS. 1B, 1C, 2A, and 2B) may eliminate, or at least reduce such frequency dependency of the gain or attenuation of the circuit 100. For example, the transistors 110, 111, 144, 148 may be matched, e.g., have substantially same dimensions, and/or may be formed using common semiconductor formation processes. Accordingly, in an example, the appropriate matched and scaled transistors 144, 148 may have substantially the same off-state capacitance as the transistors 110, 111. For example, the off-state capacitances C110, C111, C144, C148 (see FIG. 1C) may be substantially the same (e.g., within 1% of each other, or 5% of each other, or 10% of each other) for any given frequency of operation.

As described above, the off-state capacitances C110, C111 of the transistors 110, 111 may vary with a frequency of the input signals 104*a*, 104*b*. In an example, the transistors 144, 148 may be scaled similarly to the transistors 110, 111, such that the off-state capacitances C144, C148 of the transistors 144, 148 may also similarly vary with the frequency of the input signals 104*a*. 104*b*.

As the transistors 144, 148, 110, 111 have substantially the same off-state capacitance profile over the frequency range of operation, in an example, the transistors 144, 148, 110, 111 may have substantially the same leakage current amplitude profile over the frequency range of operation of the circuit 100. For example, for any given frequency within a frequency range of operation of the circuit 100, amplitudes of leakage currents through the transistors 144, 148, 110, 111 may be within 1%, or 2%, or 5%, or 10% of each other.

FIG. 2C illustrates cancellation of leakage currents in the circuit 100 of FIGS. 1A-2B during the attenuation state of operation of the attenuator circuit 100, in accordance with an embodiment of the present disclosure. For example, the input signals 104*a* and 104*b* are differential signals. Thus, in differential signaling, the two input signals 104*a* and 104*b* are complementary signals. For example, the input signals 104*a* and 104*b* are substantially equal in magnitude, but of opposite polarity. Accordingly, because of the same leakage current profiles of the transistors 110 and 148 over the frequency range of operation, the leakage current through the transistor 110 and the leakage current through the transistor 148 may be substantially equal in magnitude, but of opposing polarity, for any given frequency within the frequency range of operation.

Accordingly, as illustrated in FIG. 2C, a positive (+ve) leakage current through the transistor 110 and a negative (−ve) leakage current through the transistor 148 (or a negative leakage current through the transistor 110 and a positive leakage current through the transistor 148) cancel each other out at the output node 128*a*, such that the output signal 106*a* doesn't have any substantial contribution from the leakage currents of the transistors 110, 148.

Similarly, the leakage current through the transistor 111 and the leakage current through the transistor 144 cancel each other out at the output node 128*b*, such that the output signal 106*b* doesn't have any substantial contribution from the leakage currents of the transistors 111, 144.

Accordingly, as the leakage currents through the transistors 110, 111 don't affect the output signals 106*a*. 106*b*, the attenuation and the gain of the circuit 100 are not affected by the frequency dependency of the off-state capacitances of the transistors C110, C111. Hence, this eliminates or at least reduces frequency dependency of the attenuation of the circuit 100, and the gain of the circuit 100 may now be substantially constant (or at least less varying) over a frequency range of operation of the circuit 100. Thus, addition of the transistors 144, 148 improves gain versus frequency performance of the circuit 100 (e.g., relatively uniform attenuation ratio over frequency), without affecting the performance of the circuit 100 during the pass-through state of the circuit 100. Furthermore, relatively high attenuation factor can be achieved, e.g., at relatively high frequencies, e.g., due to cancellation of the leakage currents.

FIG. 3 illustrates an attenuator circuit 300 that is a variation of the attenuator circuit 100 of FIGS. 1A-2C, in accordance with an embodiment of the present disclosure. For example, in the attenuator circuit 100 of FIGS. 1A-2C, the transistor 144 is coupled between nodes 127*a* and 128*b*, and the transistor 148 is coupled between nodes 127*b* and 128*a*. In the circuit 300 of FIG. 3, the transistor 144 is coupled between a node 327*a* and the node 128*b*, and the transistor 148 is coupled between a node 327*b* and the node 128*a*.

The node 327*a* is between the series connected transistors 116*a* and 116*b*. Thus, a first current terminal of the transistor 144 is coupled to a current terminal of the transistor 116*a* and also to a current terminal of the transistor 116*b*; and a second current terminal of the transistor 144 is coupled to the node 128*b*. For example, the transistor 144 is coupled to the node 127*a* through the transistor 116*a*.

Similarly, the node 327*b* is between the series connected transistors 116*b* and 116*c*. Thus, a first current terminal of the transistor 148 is coupled to a current terminal of the transistor 116*b* and also to a current terminal of the transistor 116*c*; and a second current terminal of the transistor 148 is coupled to the node 128*a*. For example, the transistor 148 is coupled to the node 127*b* through the transistor 116*c*.

The operational states of the various transistors of the circuit 300 (e.g., whether enabled or turned on; or disabled or turned off) during the pass-through state and the attenuation state of the attenuator circuit 300 are same as those of the circuit 100 described above with respect to FIGS. 2A and 2B. For example, in the pass-through state, the transistors 110 and 111 are turned on, and the transistors 144 and 148 are off. Also, the transistors 116*a*, 116*c*, 118*a*, 118*c* are off. Accordingly, as the transistor 144 is coupled between nodes 327*a* and 128*b*, and because the transistor 116*a* is off, the input signal 104*a* doesn't reach the transistor 144 (e.g., is blocked by the turned off transistor 116*a*). Accordingly, leakage current through the transistor 144, during the pass-through state of the circuit 300, is eliminated or at least reduced. For similar reasons, leakage current through the transistor 148, during the pass-through state of the circuit 300, is eliminated or at least reduced, thereby improving performance of the circuit 300 over the circuit 100.

During the attenuation state, the transistors 110, 111, 144, 148 are off, and the transistors 116*a*, 116*c*, 118*a*, 118*c* are on (see FIG. 2B). Accordingly, the transistor 110 receives the input signal 104*a* and the transistor 144 also receives the input signal 104*a* (e.g., through the turned on transistor 116*a*). Similarly, the transistor 111 receives the input signal 104*b* and the transistor 148 also receives the input signal 104*b* (e.g., through the turned on transistor 116*c*). Thus, in circuit 300, the transistors 110 and 148 carry leakage currents with substantially the same magnitude and opposite polarity, and similarly, the transistors 111 and 144 carry leakage currents with substantially the same magnitude and opposite polarity. Accordingly, as described above with respect to the circuit 100, the leakage currents cancel out. Thus, comparing the circuits 300 and 100, the circuits 300 and 100 have substantially the same performance (e.g., substantially cancels out the leakage currents through the transistors 110 and 111) during the attenuation state of the attenuator circuit, and the circuit 300 has less leakage currents through the transistors 144, 148 during the pass-through state of the attenuator circuit 300 compared to that of the attenuator circuit 100.

FIG. 4 illustrates another attenuator circuit 400 that is another variation of the attenuator circuit 100 of FIGS. 1A-2C, in accordance with an embodiment of the present disclosure. For example, in the attenuator circuit 100 of FIGS. 1A-2C, the transistor 144 is coupled between nodes 127*a* and 128*b*, and the transistor 148 is coupled between nodes 127*b* and 128*a*. In the circuit 400 of FIG. 4, the transistor 144 is coupled between the node 327*a* and a node 428*b*, and the transistor 148 is coupled between the node 327*b* and a node 428*a*.

The node 428*a* is between the series connected transistors 118*a* and 118*b*. Similarly, the node 428*b* is between the series connected transistors 118*b* and 118*c*. Thus, a first current terminal of the transistor 144 is coupled to the node 327*a*; and a second current terminal of the transistor 144 is coupled to a current terminal of the transistor 118*b* and also to a current terminal of the transistor 118*c*. Similarly, a first current terminal of the transistor 148 is coupled to the node 327*b*; and a second current terminal of the transistor 148 is coupled to a current terminal of the transistor 118*a* and also to a current terminal of the transistor 118*b*.

The operational states of the various transistors of the circuit 400 (e.g., whether enabled or turned on; or disabled or turned off) during the pass-through state and the attenuation state of the attenuator circuit 400 are same as those of the circuits 100 and 300 described above with respect to FIGS. 2A and 2B. For example, in the pass-through state, the transistors 110 and 111 are turned on, and the transistors 144 and 148 are off. Also, the transistors 116*a*, 116*c*, 118*a*, 118*c* are off. Accordingly, as the transistor 144 is coupled between nodes 327*a* and 428*b*, and because the transistors 116*a* and 118*c* are off, the signals 104*a* and/or 106*b* don't reach the transistor 144 (e.g., are blocked by the turned off transistors 116*a* and/or 118*c*). Accordingly, leakage current through the transistor 144, during the pass-through state of the circuit 400, is eliminated or at least reduced. For similar reasons, leakage current through the transistor 148, during the pass-through state of the circuit 400, is eliminated or at least reduced, thereby improving performance of the circuit 400 over the circuit 400.

During the attenuation state, the transistors 110, 111, 144, 148 are off, and the transistors 116*a*, 116*c*, 118*a*, 118*c* are on (see FIG. 2B). Accordingly, the transistor 110 receives the input signal 104*a* and the transistor 144 also receives the input signal 104*a* (e.g., through the turned on transistor 116*a*). Similarly, the transistor 111 receives the input signal 104*b* and the transistor 148 also receives the input signal 104*b* (e.g., through the turned on transistor 116*c*). Thus, in circuit 400, the transistors 110 and 148 carry leakage currents with substantially the same magnitude and opposite polarity, and similarly, the transistors 111 and 144 carry leakage currents with substantially the same magnitude and opposite polarity. Accordingly, as described above with respect to the circuit 100, the leakage currents cancel out.

FIG. 5 illustrates another attenuator circuit 500, in accordance with an embodiment of the present disclosure. In this example, the attenuator network 115' of FIG. 5 is different from the attenuator network 115 of FIG. 1B. For example, in the attenuator network 115' of FIG. 5, resistors 524*a* and 524*b* are in series between the nodes 127*a* and 128*a*, and resistors 524*c* and 524*d* are in series between the nodes 127*b* and 128*b*. A shunt transistor 520 has a first current terminal coupled between the resistors 524*a* and 524*b*, and a second current terminal coupled between the resistors 524*c* and 524*d*.

Also, similar to FIG. 1B, in FIG. 5 the pass-through transistor 110 is coupled between the nodes 127*a* and 128*a*, the pass-through transistor 111 is coupled between the nodes 127*b* and 128*b*, the transistor 144 is coupled between the nodes 127*a* and 128*b*, and the transistor 148 is coupled between the nodes 127*b* and 128*a*. Similar to FIGS. 1B-2B, the transistors 144 and 148 in FIG. 5 are disabled during the pass-through state and the attenuation state, and facilitates in elimination or at least reduction of effects of leakage currents through the transistors 110 and 111, e.g., to maintain a substantially constant attenuation ratio and gain over the frequency range of operation, as described above. The operation of the attenuator circuit 500 of FIG. 5 is similar to the operation of the attenuator circuits of FIGS. 1A-4, and that above relevant discussion is equally applicable here.

Figure 6:
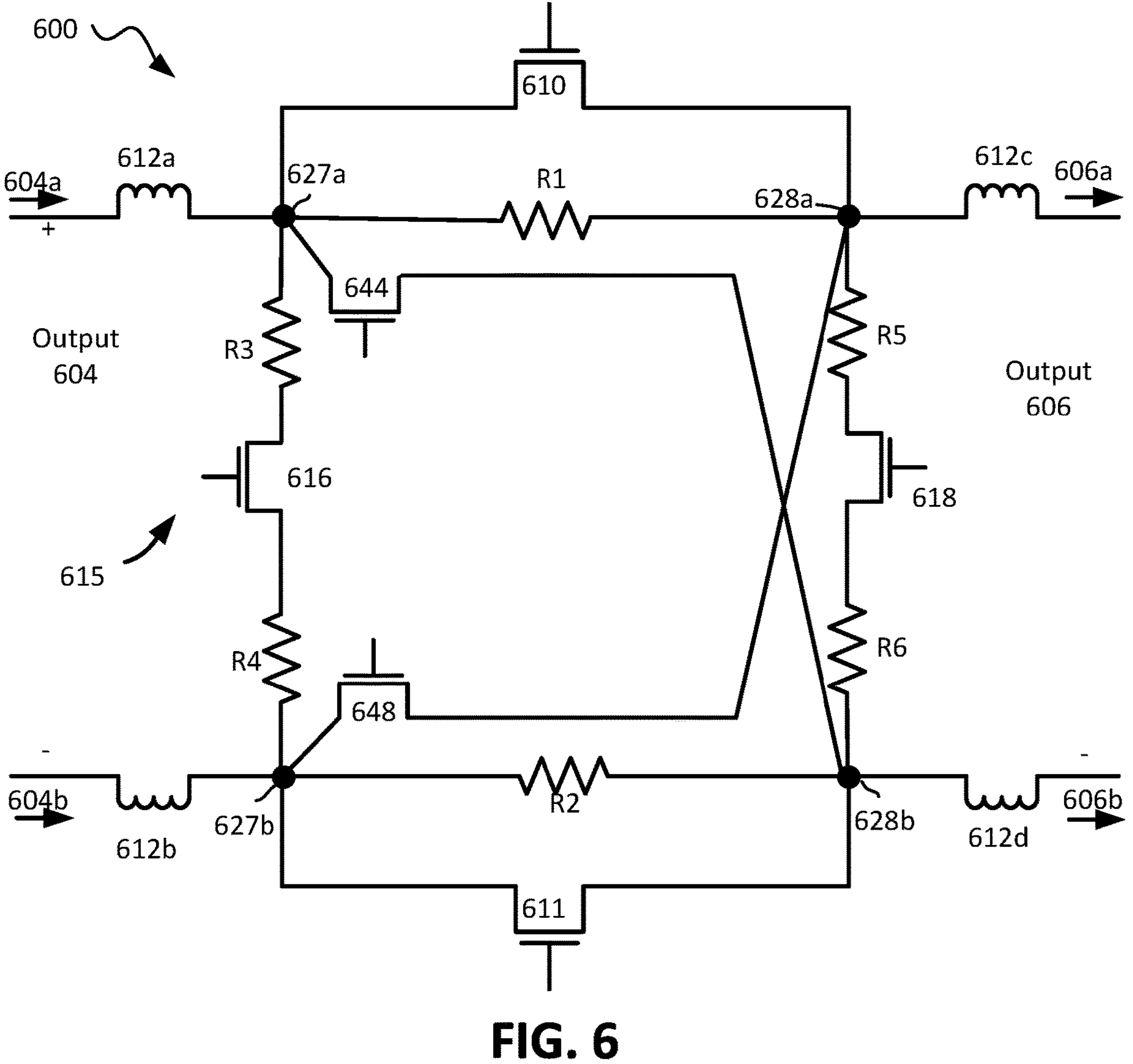
FIG. 6 illustrates another example implementation of the attenuator circuit of FIG. 1A where a "pi" attenuator network is used, in accordance with an embodiment of the present disclosure.

FIG. 6 illustrates another example implementation 600 of the attenuator circuit of FIG. 1A where a “pi” attenuator network is used, in accordance with an embodiment of the present disclosure. For example, FIGS. 1B-5 illustrate a “T” attenuator network. In contrast, the attenuator network 615 of the attenuator circuit 600 comprises a differential pi attenuator network. Similar to the description with respect to FIGS. 1B-5, the transistors 610 and 611 of the circuit 600 are turned on during the pass-through state of operation of the circuit 600, and are turned off during the attenuation state of operation of the circuit 600. The transistors 644, 648 are disabled during the pass-through state and the attenuation state, and facilitates in elimination or at least reduction of effects of leakage currents through the transistors 610 and 611, e.g., to maintain a substantially constant attenuation ratio and gain over the frequency range of operation, as described above. In an example, resistors R3, R4, R5, R6 may be removed (e.g., in which case the transistors 616, 618 may provide the necessary shunt resistance), although they may be present in another example. The operation of the attenuator circuit 600 of FIG. 6 will be apparent based on the description above with respect to the attenuator circuits of FIGS. 1A-5.

Method of Operation

FIG. 7 illustrate a flowchart depicting a method 700 of operating the attenuator circuits described herein (e.g., with respect to FIGS. 1A-5), in accordance with an embodiment of the present disclosure.

Block 704 of the method 700 illustrates processes during a pass-through state of operation, and block 708 of the method 700 illustrates processes during an attenuation state of operation of the attenuator circuit. These two states may be executed in any order, and for any duration of time.

The method 700 comprises, at 704, causing to enable, during the pass-through state of operation of the attenuator circuit, (i) a first transistor 110 coupled between a first input 127*a* and a first output 128*a*, and (ii) a second transistor 111 coupled between a second input 127*b* and a second output 128*b*; and causing to disable, during the pass-through state, (i) a third transistor 144 coupled between the first input 127*a* and the second output 128*b*, and (ii) a fourth transistor 148 coupled between the second input 127*b* and the first output 128*a*. The various transistors are illustrated in FIGS. 1A-5, and the pass-through state is illustrated specifically in FIG. 2A. In an example, the first input and the second input form a differential input, and the first output and the second output form a differential output.

As also described above, the attenuator circuit may further comprise a fifth transistor 116*a*, a sixth transistor 116*b*, and a seventh transistor 116*c* in series between the first and second inputs 127*a*, 127*b*, and an eighth transistor 118*a*, a ninth transistor 118*b*, and a tenth transistor 118*c* in series between the first and second outputs 128*a*, 128*b*. In an example, also in block 704 (although not illustrated in FIG. 7), the method 700 further comprises causing to disable, during the pass-through state, the fifth transistor, the seventh transistor, the eighth transistor, and the tenth transistor; and causing to enable, during the pass-through state, the sixth transistor and the ninth transistor.

Now referring to block 708, the method 700 comprises causing to disable, during an attenuation state of operation, the first transistor 110 and the second transistor 111; and causing to disable, during the attenuation state, (i) the third transistor 144, and (ii) the fourth transistor 148. In an example, also in block 708 (although not illustrated in FIG. 7), the method 700 further comprises causing to enable, during the attenuation state, the fifth transistor, the seventh transistor, the eighth transistor, and the tenth transistor; and causing to disable, during the attenuation state, the sixth transistor and the ninth transistor.

Note that the processes in method 700 are shown in a particular order for case of description. However, one or more of the processes may be performed in a different order or may not be performed at all (and thus be optional), in accordance with some embodiments. Numerous variations on method 700 and the techniques described herein will be apparent in light of this disclosure.

FURTHER EXAMPLE EXAMPLES

The following examples pertain to further examples, from which numerous permutations and configurations will be apparent.

Example 1. An attenuator circuit for attenuating differential signals, comprising: a differential input including a first input and a second input; a differential output including a first output and a second output; a first transistor coupled between the first input and the first output; a second transistor coupled between the second input and the second output; a third transistor coupled between the first input and the second output; and a fourth transistor coupled between the second input and the first output.

Example 2. The attenuator circuit of example 1, wherein during a pass-through state of operation of the attenuator circuit: the first and second transistors are enabled; and the third and fourth transistors are disabled.

Example 3. The attenuator circuit of any one of examples 1-2, wherein during an attenuation state of operation of the attenuator circuit: the first and second transistors are disabled; and the third and fourth transistors are disabled.

Example 4. The attenuator circuit of any one of examples 1-3, wherein the third and fourth transistors are disabled, irrespective of whether the first and second transistors are enabled or disabled and irrespective of a state of operation of the attenuator circuit.

Example 5. The attenuator circuit of any one of examples 1-4, wherein the first, second, third, and fourth transistors are substantially matched.

Example 6. The attenuator circuit of any one of examples 1-5, wherein when disabled, the first, second, third, and fourth transistors have leakage currents having amplitudes that are within 10% of each other for any given operating frequency of the attenuator circuit.

Example 7. The attenuator circuit of any one of examples 1-6, further comprising: an attenuator network having first and second input terminals, and first and second output terminals, wherein the first and second input terminals are respectively coupled to the first and second inputs of the differential input, and the first and second output terminals are respectively coupled to the first and second outputs of the differential output.

Example 8. The attenuator circuit of any one of examples 1-7, further comprising: a fifth transistor, a sixth transistor, and a seventh transistor in series between the first and second inputs, wherein the third transistor is coupled to the first input node through the fifth transistor.

Example 9. The attenuator circuit of example 8, wherein the fourth transistor is coupled to the second input node through the seventh transistor.

Example 10. The attenuator circuit of any one of examples 1-9, further comprising: a fifth transistor, a sixth transistor, and a seventh transistor in series between the first and second outputs; wherein the third transistor is coupled to the first output node through the fifth transistor; and wherein the fourth transistor is coupled to the second output node through the seventh transistor.

Example 11. The attenuator circuit of any one of examples 1-10, further comprising: a fifth transistor, a sixth transistor, and a seventh transistor in series between the first and second inputs, an eighth transistor, a ninth transistor, and a tenth transistor in series between the first and second outputs; a first resistor having a first end coupled between the fifth and sixth transistors, and a second end coupled to a second resistor; and the second resistor having a first end coupled to the first resistor, and a second end coupled between the eighth and ninth transistors.

Example 12. The attenuator circuit of example 11, further comprising: a third resistor having a first end coupled between the sixth and seventh transistors, and a second end coupled to a fourth resistor; the fourth resistor having a first end coupled to the third resistor, and a second end coupled between the ninth and tenth transistors; and an eleventh transistor having (i) a first current terminal coupled between the first and second resistors, and (ii) a second current terminal coupled between the third and fourth resistors, Example 13. The attenuator circuit of example 12, wherein an on-resistance of the eleventh transistor is less than that of one or more of the fifth, sixth, seventh, eighth, ninth, and tenth transistors.

Example 14. The attenuator circuit of any one of examples 1-13, wherein a pair of input signals received at the first and second inputs are a differential radio frequency (RF) signal.

Example 15. An apparatus comprising: a first pass-through transistor for transmitting a first input signal from a first input to a first output during a pass-through state of operation of the apparatus; a second pass-through transistor for transmitting a second input signal from a second input to a second output during the pass-through state of operation of the apparatus, wherein the first and second pass-through transistors are disabled during an attenuation state of operation of the apparatus; a circuit coupled to the first and second inputs and to the first and second outputs, the circuit configured to attenuate the first and second input signals between the first and second inputs and the first and second outputs; a first component coupled between the first input and the second output, and a second component coupled between the second input and the first output; wherein leakage currents through each of the first and second pass-through transistors and the first and second components are within 10% of each other for any given operating frequency of the apparatus.

Example 16. The apparatus of example 15, wherein the first and second components are respectively a first transistor and a second transistor that are substantially matched with each of the first and second pass-through transistors.

Example 17. The apparatus of any one of examples 15-16, wherein the first and second transistors are disabled during the pass-through state of operation and the attenuation state of operation.

Example 18. The apparatus of any one of examples 15-17, wherein the circuit comprises: a first transistor, a second transistor, and a third transistor in series between the first and second inputs, a fourth transistor, a fifth transistor, and a sixth transistor in series between the first and second outputs; a first resistor having a first end coupled between the first and second transistors, and a second end coupled to a second resistor; the second resistor having a first end coupled to the first resistor, and a second end coupled between the fourth and fifth transistors; a third resistor having a first end coupled between the second and third transistors, and a second end coupled to a fourth resistor; the fourth resistor having a first end coupled to the third resistor, and a second end coupled between the fifth and sixth transistors; and an seventh transistor having (i) a first current terminal coupled between the first and second resistors, and (ii) a second current terminal coupled between the third and fourth resistors.

Example 19. A method of operating an attenuator circuit for attenuating differential signals, the method comprising: causing to enable, during a pass-through state, (i) a first transistor coupled between a first input and a first output, and (ii) a second transistor coupled between a second input and a second output, wherein the first input and the second input form a differential input, and the first output and the second output form a differential output; causing to disable, during an attenuation state, the first transistor and the second transistor; and causing to disable, during both the pass-through state and the attenuation state. (i) a third transistor coupled between the first input and the second output, and (ii) a fourth transistor coupled between the second input and the first output.

Example 20. The method of example 19, wherein: a fifth transistor, a sixth transistor, and a seventh transistor are in series between the first and second inputs, and an eighth transistor, a ninth transistor, and a tenth transistor are coupled in series between the first and second outputs; and the method further comprises causing to disable, during the pass-through state, the fifth transistor, the seventh transistor, the eighth transistor, and the tenth transistor; and causing to enable, during the pass-through state, the sixth transistor and the ninth transistor.

Example 21. The method of any one of examples 19-20, further comprising: causing to enable, during the attenuation state, the fifth transistor, the seventh transistor, the eighth transistor, and the tenth transistor; and causing to disable, during the attenuation state, the sixth transistor and the ninth transistor.

Numerous specific details have been set forth herein to provide a thorough understanding of the examples. It will be understood, however, that other examples may be practiced without these specific details, or otherwise with a different set of details. It will be further appreciated that the specific structural and functional details disclosed herein are representative of examples and are not necessarily intended to limit the scope of the present disclosure. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims. Furthermore, examples described herein may include other elements and components not specifically described, such as electrical connections, signal transmitters and receivers, processors, or other suitable components for operation of the antenna system 100.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and examples have been described herein. The features, aspects, and examples are susceptible to combination with one another as well as to variation and modification, as will be appreciated in light of this disclosure. The present disclosure should, therefore, be considered to encompass such combinations, variations, and modifications. It is intended that the scope of the present disclosure be limited not by this detailed description, but rather by the claims appended hereto. Future filed applications claiming priority to this application may claim the disclosed subject matter in a different manner and may generally include any set of one or more elements as variously disclosed or otherwise demonstrated herein.

What is claimed is:

1. An attenuator circuit for attenuating differential signals, comprising:

a differential input including a first input and a second input;

a differential output including a first output and a second output;

a first transistor coupled between the first input and the first output;

a second transistor coupled between the second input and the second output;

a third transistor coupled between the first input and the second output; and a fourth transistor coupled between the second input and the first output, wherein during a pass-through state of operation of the attenuator circuit:

the first and second transistors are enabled; and the third and fourth transistors are disabled.

2. The attenuator circuit of claim 1, wherein a pair of input signals received at the first and second inputs are a differential radio frequency (RF) signal.

3. The attenuator circuit of claim 1, wherein during an attenuation state of operation of the attenuator circuit:

the first and second transistors are disabled; and the third and fourth transistors are enabled.

4. The attenuator circuit of claim 1, wherein the third and fourth transistors are disabled, irrespective of whether the first and second transistors are enabled or disabled and irrespective of a state of operation of the attenuator circuit.

5. The attenuator circuit of claim 1, wherein the first, second, third, and fourth transistors are substantially matched in off-state leakage current within 10%.

6. The attenuator circuit of claim 1, wherein when disabled, the first, second, third, and fourth transistors have leakage currents having amplitudes that are within 10% of each other for any given operating frequency of the attenuator circuit.

7. The attenuator circuit of claim 1, further comprising: an attenuator network coupled between the first and second inputs of the differential input, and the first and second outputs of the differential output.

8. The attenuator circuit of claim 1, further comprising:

a fifth transistor, a sixth transistor, and a seventh transistor in series between the first and second inputs, wherein the third transistor is coupled to the first input through the fifth transistor.

9. The attenuator circuit of claim 8, wherein the fourth transistor is coupled to the second input through the seventh transistor.

10. The attenuator circuit of claim 1, further comprising:

a fifth transistor, a sixth transistor, and a seventh transistor in series between the first and second outputs;

wherein the third transistor is coupled to the first output through the fifth transistor; and wherein the fourth transistor is coupled to the second output node through the seventh transistor.

11. The attenuator circuit of claim 1, further comprising:

a fifth transistor, a sixth transistor, and a seventh transistor in series between the first and second inputs, an eighth transistor, a ninth transistor, and a tenth transistor in series between the first and second outputs;

a first resistor having a first end coupled between the fifth and sixth transistors, and a second end coupled to a second resistor; and the second resistor having a first end coupled to the first resistor, and a second end coupled between the eighth and ninth transistors.

12. The attenuator circuit of claim 11, further comprising:

a third resistor having a first end coupled between the sixth and seventh transistors, and a second end coupled to a fourth resistor;

the fourth resistor having a first end coupled to the third resistor, and a second end coupled between the ninth and tenth transistors; and an eleventh transistor having (i) a first current terminal coupled between the first and second resistors, and (ii) a second current terminal coupled between the third and fourth resistors.

13. The attenuator circuit of claim 12, wherein an on-resistance of the eleventh transistor, when enabled, is less than that of one or more of the fifth, sixth, seventh, eighth, ninth, and tenth transistors.

* * * * *